United States Patent
Noh et al.

(10) Patent No.: US 7,502,043 B2
(45) Date of Patent: Mar. 10, 2009

(54) LASER INDUCED THERMAL IMAGING APPARATUS AND LASER INDUCED THERMAL IMAGING METHOD AND FABRICATING METHOD OF ORGANIC LIGHT-EMITTING DIODE USING THE SAME

(75) Inventors: Sok Won Noh, Seoul (KR); Mu Hyun Kim, Yongin-si (KR); Sang Bong Lee, Yongin-si (KR); Sun Hoe Kim, Jeongeup-so (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 225 days.

(21) Appl. No.: 11/508,159

(22) Filed: Aug. 23, 2006

(65) Prior Publication Data

US 2007/0109391 A1    May 17, 2007

(30) Foreign Application Priority Data

Nov. 16, 2005    (KR)    ........... 10-2005-0109818

(51) Int. Cl.
*B41J 2/315*    (2006.01)
(52) U.S. Cl. ..................................... 347/171
(58) Field of Classification Search ............. 347/171, 347/222, 224, 225, 228, 239, 245, 263
See application file for complete search history.

(56) References Cited

U.S. PATENT DOCUMENTS

| 4,377,339 A | 3/1983 | Coppock | |
| 6,666,541 B2 * | 12/2003 | Ellson et al. | ............ 506/12 |

FOREIGN PATENT DOCUMENTS

| EP | 0790138 | 10/1999 |
| JP | 2004-296224 | 10/2004 |
| JP | 2004-355949 | 12/2004 |
| TW | 369483 | 9/1999 |

* cited by examiner

*Primary Examiner*—K. Feggins
(74) *Attorney, Agent, or Firm*—Stein, McEwen & Bui, LLP

(57) ABSTRACT

A laser induced thermal imaging apparatus and a laser induced thermal imaging method capable of uniformly adhering a donor film to an acceptor substrate by use of a magnetic force to achieve an effective laser induced thermal imaging method; and a method for fabricating an organic light-emitting diode using the same. The laser induced thermal imaging apparatus includes: a chamber in which a contact frame having a magnetic substance is located, to press toward an acceptor substrate containing a magnet located on a substrate stage with an imaging layer of a donor film located between the acceptor substrate and the contact frame; and a laser oscillator to irradiate the donor film through openings in the contact frame. Accordingly, the laser induced thermal imaging apparatus applies an improved adhesion between the donor film and the substrate, producing an organic light-emitting diode having an improved life span, yield and reliability.

18 Claims, 8 Drawing Sheets

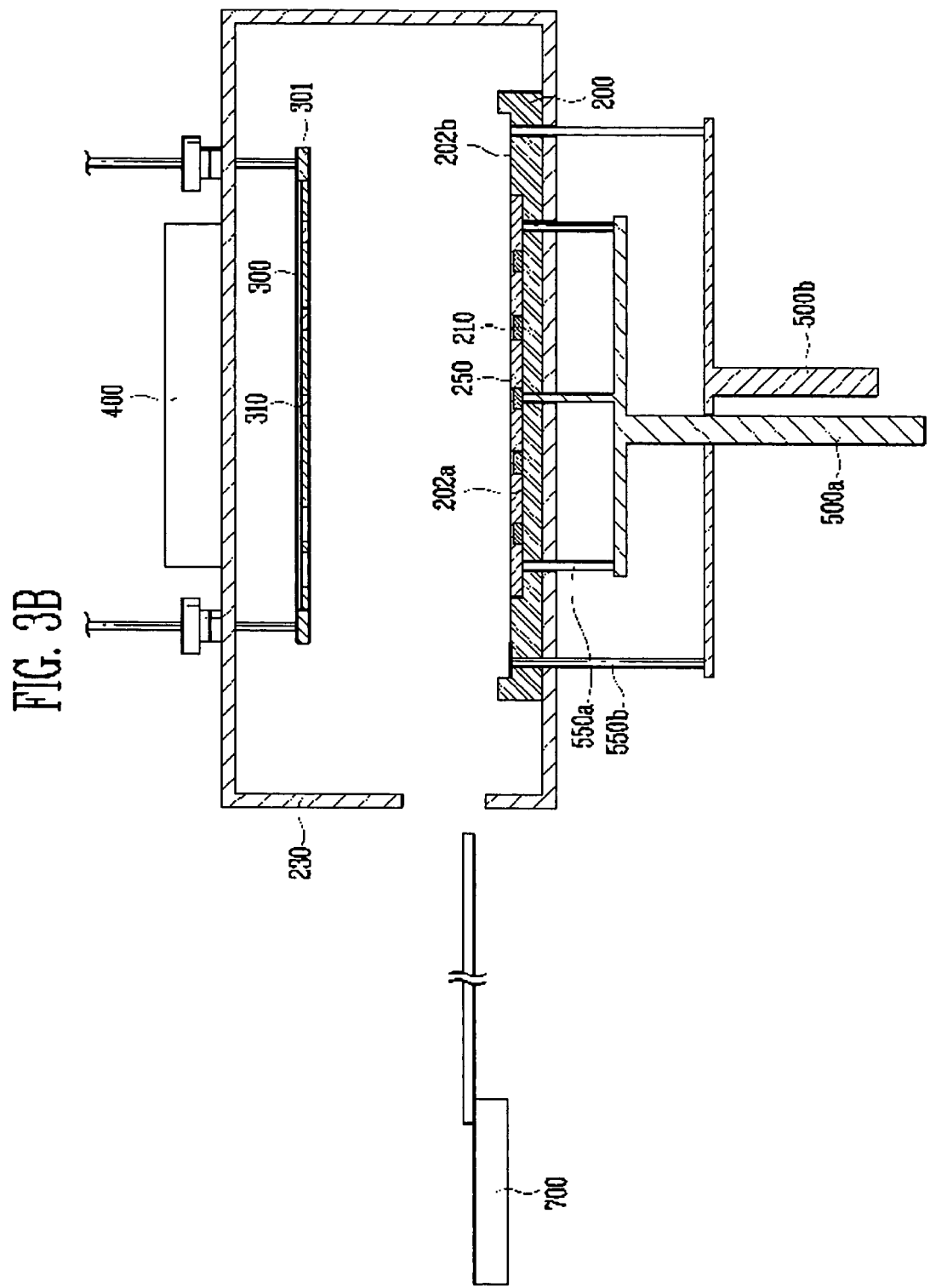

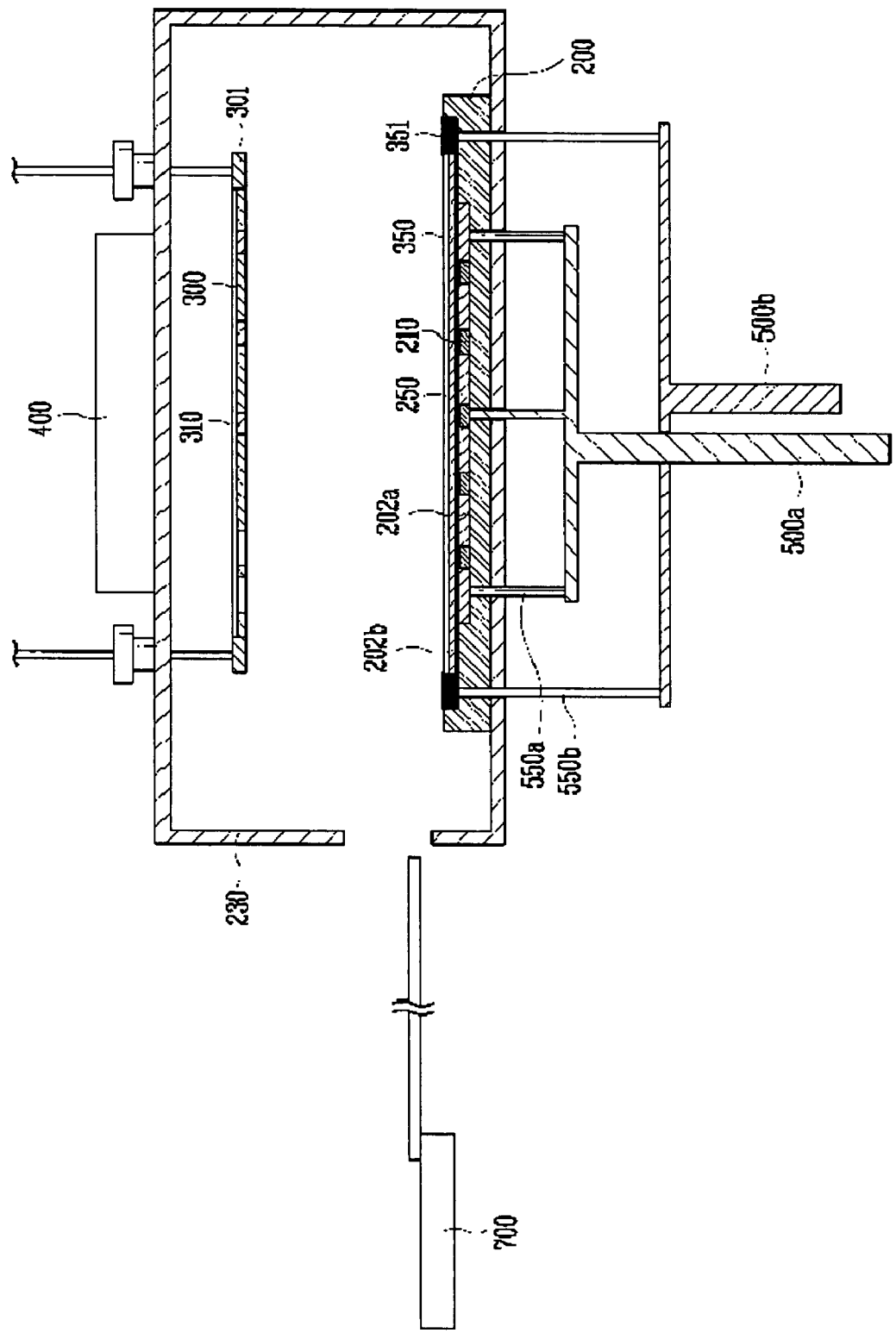

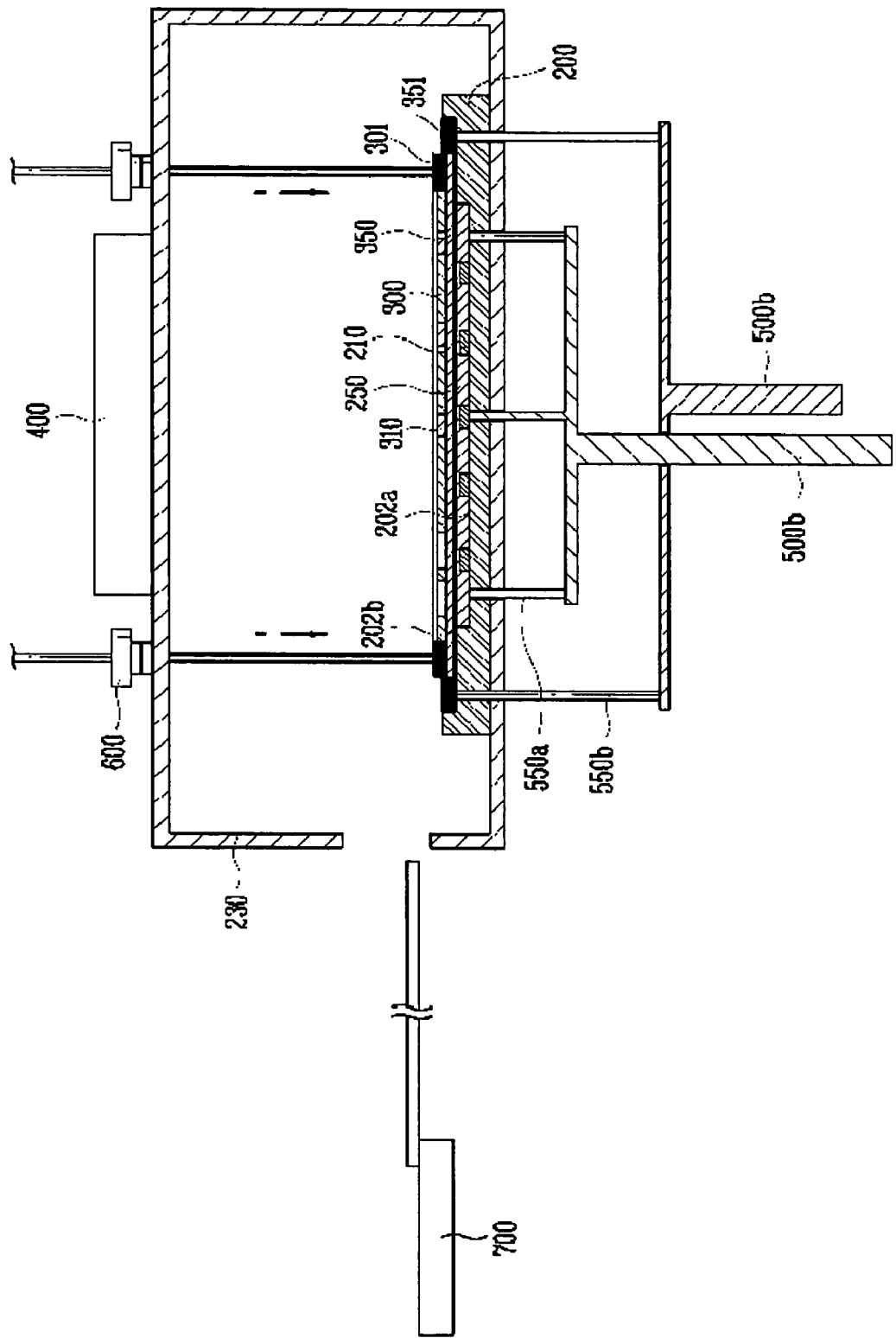

LASER INDUCED THERMAL IMAGING APPARATUS AND LASER INDUCED THERMAL IMAGING METHOD AND FABRICATING METHOD OF ORGANIC LIGHT-EMITTING DIODE USING THE SAME

CROSS-REFERENCE TO RELATED APPLICATIONS

This application claims the benefit of Korean Application No. 2005-109818, filed Nov. 16, 2005, in the Korean Intellectual Property Office, the disclosure of which is incorporated herein by reference.

BACKGROUND OF THE INVENTION

1. Field of the Invention

Aspects of the present invention relate to a laser induced thermal imaging apparatus and a laser induced thermal imaging method, and a fabricating method of an organic light-emitting diode using the same, and more specifically to a laser induced thermal imaging apparatus and a laser induced thermal imaging method capable of improving adhesion between an acceptor substrate and an imaging layer of a donor film by means of a magnetic force by providing the substrate with a magnet and a contact frame having a magnetic substance when an organic film layer is laminated on the acceptor substrate using the laser induced thermal imaging method; and a fabricating method of an organic light-emitting diode using the same.

2. Description of the Related Art

Aspects of the present invention relate to a laser induced thermal imaging apparatus and a laser induced thermal imaging method, and a fabricating method of an organic light-emitting diode using the same, and more specifically, to a laser induced thermal imaging apparatus and a laser induced thermal imaging method capable of improving adhesion between an acceptor substrate and an imaging layer of a donor film by a magnetic force by providing the substrate with a magnet and a contact frame with a magnetic substance when an organic film layer of the donor film is laminated on the acceptor substrate using the laser induced thermal imaging method; and a fabricating method of an organic light-emitting diode using the same.

Among methods for forming an organic film layer of an organic light-emitting diode, a deposition method, in which an organic film layer is formed by vacuum-depositing an organic light-emitting material with a shadow mask, has disadvantages such as it is difficult to form a superfine micro-pattern due to such issues as a deformed mask, etc., and it is also difficult to be applied to a large-area display.

In order to solve the problems of the deposition method, there has been proposed an ink jet method for directly patterning an organic film layer. The ink jet process is a method for forming an organic film layer by discharging a discharge solution from a head of the ink jet printer, where the discharge solution is made by dissolving or dispersing a light-emitting material in a solvent. The ink jet process is relatively simple in processing, but has disadvantages such as a reduced yield and a non-uniform film thickness, and it is difficult to apply to a large-area display.

Meanwhile, there has been proposed a method for forming an organic film layer using a laser induced thermal imaging process. In the laser induced thermal imaging method, an imaging layer is closely adhered to an acceptor substrate and then transferred thereto by the heat of a laser beam. The transfer is accomplished by scanning a laser to a donor film which includes a base substrate, a light-heat converting layer and an imaging layer; converting the laser beam passed through the base substrate into heat in the light-heat converting layer to extend the light-heat converting layer, and extending the adjacent imaging layers such that where the laser beam is scanned the organic layer is transferred to the acceptor substrate. Inherent advantages of the laser induced thermal imaging method include high-resolution pattern formation, uniformity of film thickness, an ability to laminate a multilayer, and extendibility into large-sized motherglasses.

The conventional laser induced thermal imaging method is typically carried out under a vacuum so that a same chamber in which the light-emitting layer is transferred can be aligned with other deposition processes upon forming the light-emitting device, but when the laser induced thermal transfer is carried out under a vacuum state according to the conventional method, it has a disadvantage that a transfer property of the imaging layer is diminished since a coupling force between the donor film and the acceptor substrate is reduced. Accordingly, a method to laminate a donor film and an acceptor substrate is quite beneficial in the case of the laser induced thermal imaging method, and therefore there have been attempts to solve the problems.

Hereinafter, a conventional laser induced thermal imaging method and a conventional laser induced thermal imaging apparatus will be described in detail referring to the accompanying drawings.

FIG. 1 is a partial cross-sectional view showing a conventional laser induced thermal imaging apparatus.

Referring to FIG. 1, the laser induced thermal imaging apparatus 100 includes a substrate stage 120 arranged inside of a chamber 110 and a laser irradiation apparatus 130 arranged on an upper portion of the chamber 110.

The substrate stage 120 sequentially arranges an acceptor substrate 140 and a donor film 150 introduced into the chamber 110, wherein the first anchoring groove 121 and the second anchoring groove 123 for arranging an acceptor substrate 140 and a donor film 150, respectively, are formed in the substrate stage 120. The first anchoring groove 121 is formed along a circumferential direction of the acceptor substrate 140, and the second anchoring groove 123 is formed along a circumferential direction of the donor film 150. Generally, the acceptor substrate 140 has a smaller area than that of the donor film 150, and therefore the first anchoring groove 121 is formed at a smaller size than that of the second anchoring groove 123.

At this time, in order to carry out the lamination without a foreign substance 101 or a space between the acceptor substrate 140 and the donor film 150, the inside of the chamber 110 in which the laser induced thermal transfer is generated is not maintained under a vacuum, and pipes 161, 163 each connect a lower portion of the first anchoring groove 121 and the second anchoring groove 123, respectively, to a suction port of a vacuum pump P to couple the acceptor substrate 140 and the donor film 150 to each other by suction.

However, while other methods for manufacturing an organic light-emitting diode are performed in a vacuum, the method of closely adhering the acceptor substrate and the donor film by suction of the vacuum pump is ineffective when such a vacuum state exists inside the chamber, and therefore the other methods have a disadvantage that the life span and the reliability of the products are adversely affected due to inadequate coupling.

SUMMARY OF THE INVENTION

Aspects of the present invention are designed to solve the above and/or other drawbacks of the prior art, as described above. Accordingly, aspects of the present invention provide a laser induced thermal imaging apparatus and a laser induced thermal imaging method capable of forming an organic light-emitting layer by transferring an imaging layer of a donor film using a magnetic force between a contact frame and an acceptor substrate; and a fabricating method of an organic light-emitting diode using the same.

An aspect of the present invention provides a laser induced thermal imaging apparatus including a processing chamber having a donor film and an acceptor substrate to carry out a process for transferring an imaging layer of the donor film onto the acceptor substrate; a substrate stage arranged in the processing chamber, and supporting the acceptor substrate containing a magnet; a contact frame arranged in the chamber positioned such that the donor film is between the acceptor substrate and the contact frame in the processing chamber, and the contact frame having a magnetic substance; and a laser oscillator formed either outside or inside of the processing chamber.

Another aspect of the present invention provides a laser induced thermal imaging method, including operations of arranging an acceptor substrate in which a magnet is formed in at least one surface thereof, between contact frames of a substrate stage and an opposing contact frame part having a magnetic substance in a processing chamber; arranging a donor film having an imaging layer on the acceptor substrate; laminating the donor film and the acceptor substrate by a magnetic force acting between the magnetic substance formed in the contact frame and the magnet of the acceptor substrate; and transferring at least one region of the imaging layer onto the acceptor substrate by scanning a laser irradiation on the donor film.

Another aspect of the present invention is achieved by providing a method for fabricating an organic light-emitting diode in which a light-emitting layer is formed between a first electrode layer and a second electrode layer using a laser induced thermal imaging method, including an acceptor substrate-transmission operation of arranging an acceptor substrate in a substrate stage portion of a contact frame including a magnetic substance, wherein the acceptor substrate has a pixel region and includes a magnet; a donor film-transmission operation of arranging on the acceptor substrate the donor film having a light-emitting layer; a lamination operation of coupling the acceptor substrate and the donor film to each other using a magnetic force between the magnet formed in the acceptor substrate and the magnetic substance formed in the contact frame; and a transfer operation of transferring the light-emitting layer to the pixel region of the acceptor substrate by scanning a laser irradiation to the donor film.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 3A to 3E are cross-sectional views showing a laser induced thermal imaging method according to an embodiment of the present invention.

DETAILED DESCRIPTION OF THE EXAMPLE EMBODIMENTS

Figure 1:
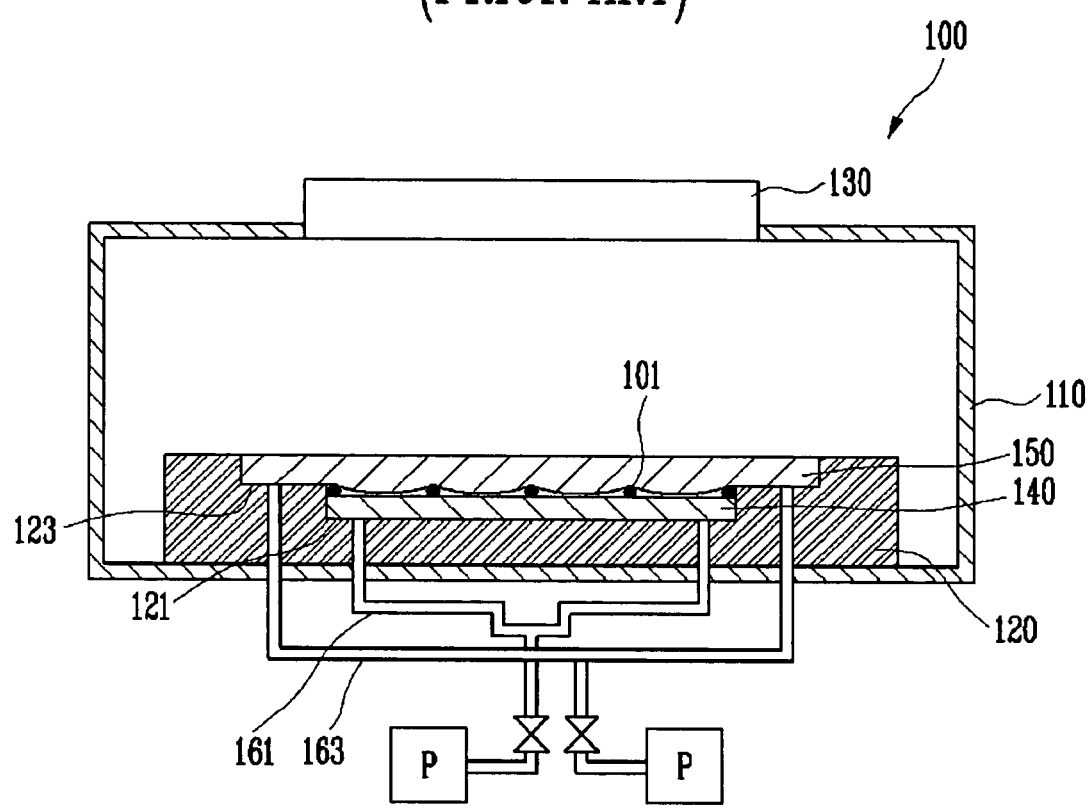
FIG. 1 is a partial cross-sectional view showing a conventional laser induced thermal imaging apparatus.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
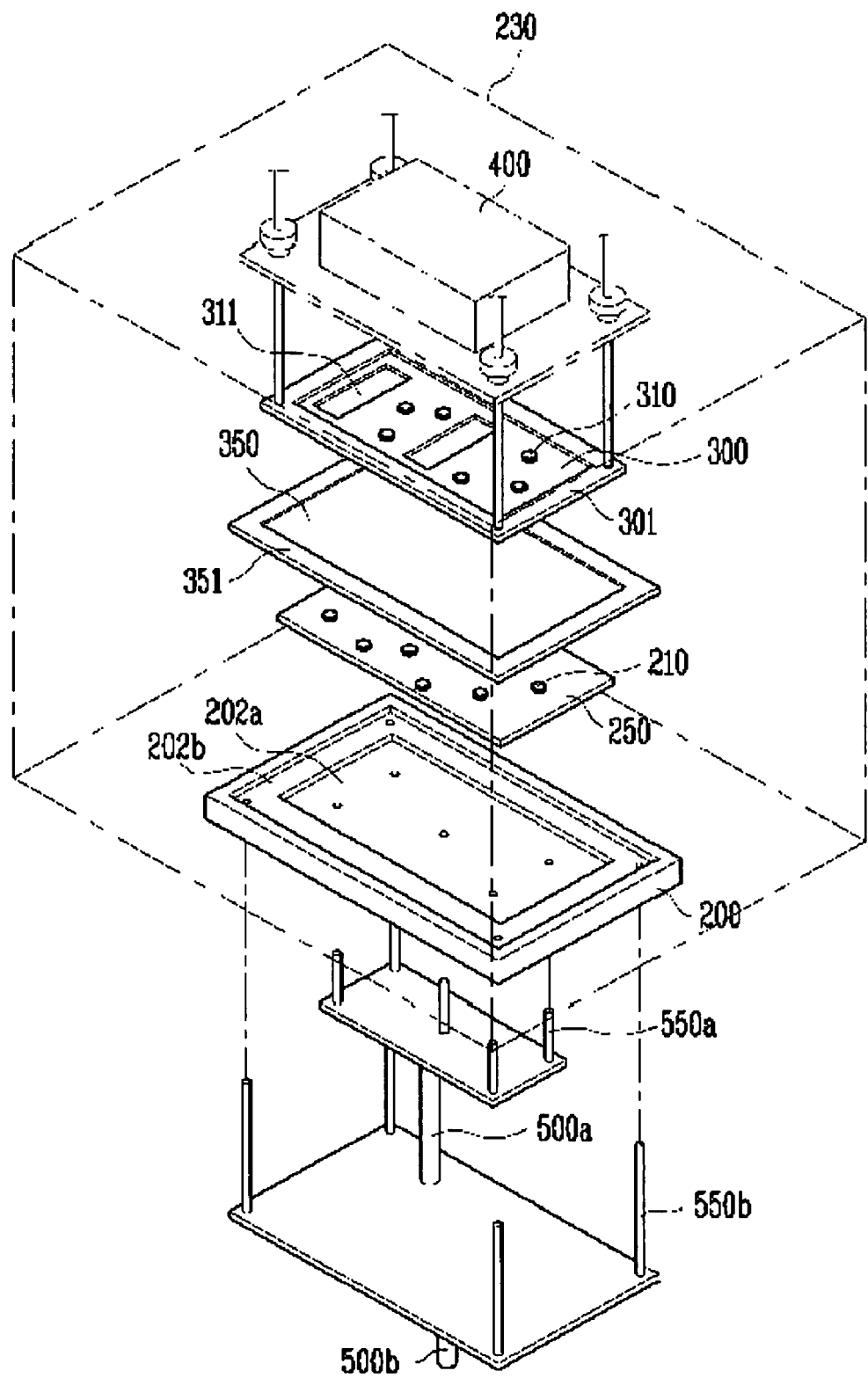
FIG. 2 is a perspective view showing an embodiment of a laser induced thermal imaging apparatus according to an aspect of the present invention.

FIG. 2 is a perspective view showing one embodiment of a laser induced thermal imaging apparatus according to an aspect of the present invention. Referring to FIG. 2, the laser induced thermal imaging apparatus includes a chamber 230, a substrate stage 200, a contact frame 300, a laser oscillator 400, and ascent/descent units 500a, 500b.

A process for transferring a donor film 350 which is a deposition resource is carried out in the processing chamber 230 so as to transfer a determined organic material. Accordingly, at least a substrate stage 200 and a contact frame 300 are provided inside the processing chamber 230 as a unit for carrying out a process for bonding a substrate 250 and the donor film 350 to each other while the processing chamber 230 is under a vacuum state.

The substrate stage 200 has a first arrangement groove 202a and a second arrangement groove 202b for arranging an acceptor substrate 250 and the donor film 350, respectively. Generally, the donor film 350 has a larger area than the acceptor substrate 250, and therefore the second arrangement groove 202b is formed along the shape of the donor film 350 outside a perimeter of the first arrangement groove 202a. The first arrangement groove 202a and the second arrangement groove 202b are formed to have a predetermined depth difference, and the second arrangement groove 202b is formed at a predetermined greater depth than the first arrangement groove 202a.

The contact frame 300 has a magnetic substance 310, and is arranged in an upper portion of the processing chamber 230 compared to the substrate stage 200 with the donor film 350 and the acceptor substrate 250 positioned between the contact frame 300 and the substrate stage 200. The contact frame 300 has an opening 311 formed in a region corresponding to a pattern where the donor film 350 is transferred to the substrate 250. That is, the donor film 350 is used as a transfer source for transferring an organic material onto the acceptor substrate 250. Accordingly, the predetermined pattern of the opening 311 in the contact frame 300 is as large as necessary to allow the transfer of the donor film 350 onto the acceptor substrate 250. The contact frame 300 itself may be formed of the magnetic substance 310, and the magnetic substance 310 may be formed in an upper or a lower surface of the contact frame 300. The contact frame 300 is connected to a contact frame tray 301 which is driven up and down.

Although the description of the embodiments of the present invention refers to positions of elements oriented in a vertical arrangement, it is understood that the present invention is not limited thereto, that is, the elements can be oriented horizontally. For example, the substrate stage 200 can be arranged in a right side of the processing chamber 230, the acceptor substrate 250 having magnets 210 can be placed in the first arrangement groove 202a on a left side of the substrate stage 200, the donor film 350 can be placed in the second arrangement groove 202b to the left of the acceptor substrate 250 and laminated thereto by the contact frame pressing from right to left by the driving mechanism and/or a magnetic force between the acceptor substrate magnets 210 and magnetic substance 310 when the contact frame 300, located in a left portion of the processing chamber 230 is driven to the right. Similarly, the laser oscillator 400, can be located in a horizontal direction from the donor film 350 to irradiate a laser beam horizontally to the donor film 350.

The magnet 210 is stuck to an upper or lower surface of the acceptor substrate 250, and may be formed in the upper or lower surface of the acceptor substrate 250 or between the substrate 250 and a buffer layer (not shown). The contact frame 300 closely adheres the acceptor substrate 250 and the donor film 350 to each other by a magnetic force between the contact frame and the acceptor substrate 250. Accordingly, the contact frame 300 and the acceptor substrate 250 have a magnetic substance and a magnet, respectively. For example, the acceptor substrate 250 includes the permanent magnet 210 and the contact frame 300 is formed of the magnetic substance 310, or the acceptor substrate 250 includes an electromagnet (not shown) and the contact frame 300 is formed of the magnetic substance. According to various embodiments, the permanent magnet and the electromagnet can be formed in the shape of a rod, disk, bar, cylinder, honeycomb, thin film, nanoparticles, etc.

The laser oscillator 400 may be positioned either outside or inside the chamber 230, and arranged above the contact frame 300 to irradiate a laser onto the contact frame 300.

Ascent/descent units 500a, 500b are divided into a first ascent/descent unit 500a and a second ascent/descent unit 500b. The first ascent/descent unit 500a has a first pin 550a to drive the acceptor substrate 250 up and down, and the second ascent/descent unit 500b has a second pin 550b to drive the donor film 350 up and down. For example, the first ascent/descent unit 500a first moves up to receive the acceptor substrate 250 from a migration unit (not shown), and then moves down to arrange the acceptor substrate 250 in the first arrangement groove 202a. Then, the second ascent/descent unit 500b moves up to receive the donor film 350 from the migration unit (not shown), and then moves down to arrange the acceptor substrate 250 in the second arrangement groove 202b. The acceptor substrate 250 and the donor film 350 are brought into contact with each other by such an operation. The donor film 350 is then fixed by the film tray 301 from moving up and down.

The aforementioned laser induced thermal imaging apparatus according to an aspect of the present invention further has an ascent/descent-driving unit (not shown) to connect with the contact frame tray 301 and the contact frame 300, such that the contact frame 300 is driven up and down by the ascent/descent-driving unit.

FIGS. 3A to 3E are cross-sectional views showing a laser induced thermal imaging method according to an embodiment of the present invention.

Figure 3A:
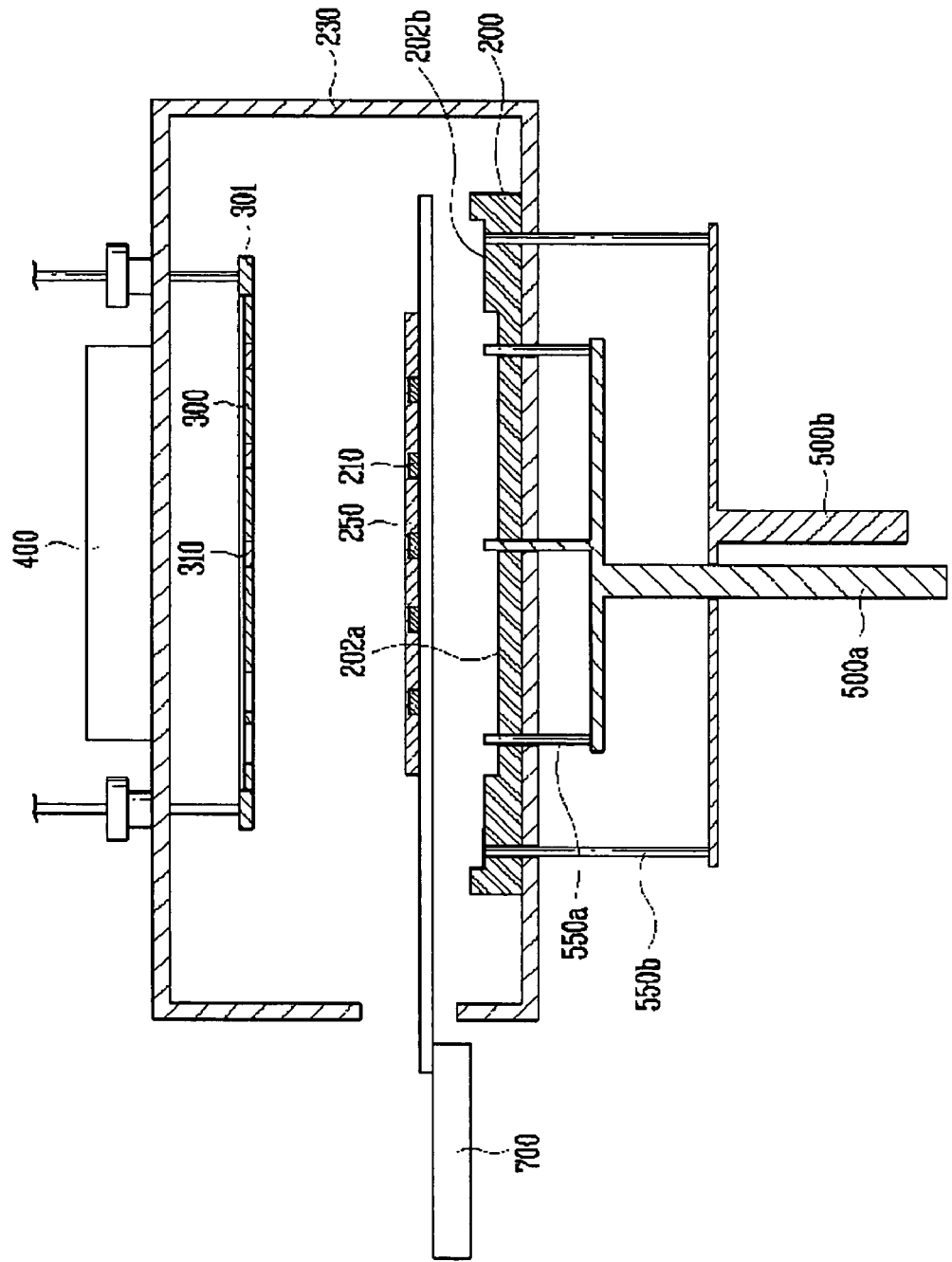

Referring to FIGS. 3A to 3E, the laser induced thermal imaging method according to an aspect of the present invention has a predetermined processing chamber 230, and uses an end-effector 700 to arrange the substrate 250 in the first arrangement groove 202a of the substrate stage 200. The first ascent/descent unit 500a moves up to receive the substrate 250 from the end-effector 700 using the first pin 550a to support the substrate 250 (FIG. 3A). The end-effector 700 slips out of the processing chamber 230 (FIG. 3B) while the first ascent/decent unit 500a lowers the substrate 250 into the first arrangement groove 202a.

Figure 3C:
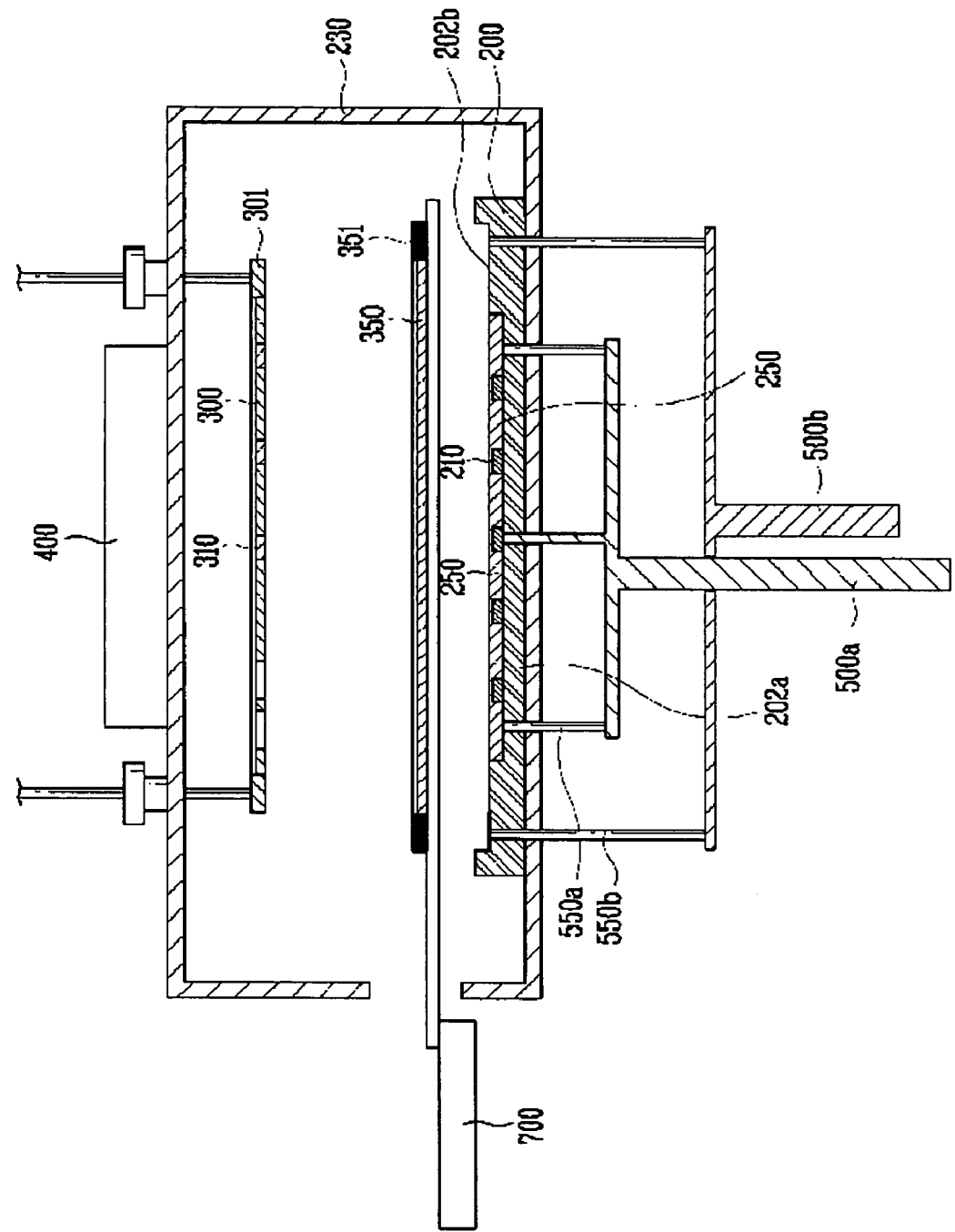

In the next process, the end-effector 700 is used to arrange the donor film 350 in the second arrangement groove 202b of the substrate stage 200. The second ascent/descent unit 500b moves up to receive the donor film 350 from the end-effector 700 using the second pin 550b provided in the second ascent/descent unit 500b to support the donor film 350 (FIG. 3C). Then, the donor film 350 is placed on top of and closely adhered to the acceptor substrate 250 by arranging the donor film 350 in the second arrangement groove 202b while it remains fixed to a film tray 351 (FIG. 3D).

Then, the contact frame 300 is brought into contact with and closely adhered to the donor film 350 by exerting a closely adhesive force so that microcavities cannot be generated between the acceptor substrate 250 and the donor film 350, each closely adhered to the other. At this time, the contact frame 300 is fixed by the contact frame tray 301. The closely adhesive property between the acceptor substrate 250 and the donor film 350 may be improved by controlling the closely adhesive force between the contact frame 300 and the acceptor substrate 250 since the magnet 210 is provided in an upper or lower surface of the acceptor substrate 250. In the subsequent process, the laser oscillator 400 is used to carry out a laser transfer process through a predetermined pattern of openings 311 in the contact frame 300. By the laser irradiation process, the donor film 350 is transferred onto the substrate 250 in the predetermined pattern since the donor film 350 is a transfer source in which an organic material is transferred onto the acceptor substrate 250. Accordingly, the contact frame openings 311 are in the predetermined pattern to allow the laser scanned through the openings 311 to transfer the predetermined pattern of the organic material onto the acceptor substrate 250. That is, the contact frame 300 may function as a mask in which the laser may be scanned only to a predetermined region (FIG. 3E).

According to the aforementioned laser induced thermal imaging method according to an aspect of the present invention, the donor film 350 is closely adhered to the acceptor substrate 250, and the acceptor substrate 250 is fixed by the process of applying a load to the contact frame 300, where the process is carried out by allowing the contact frame 300 to move down. And when the process shown in FIG. 3E is completed, the ascent/descent-driving unit (not shown) is used to allow the contact frame 300 to move up to return to an original position.

Figure 4A:
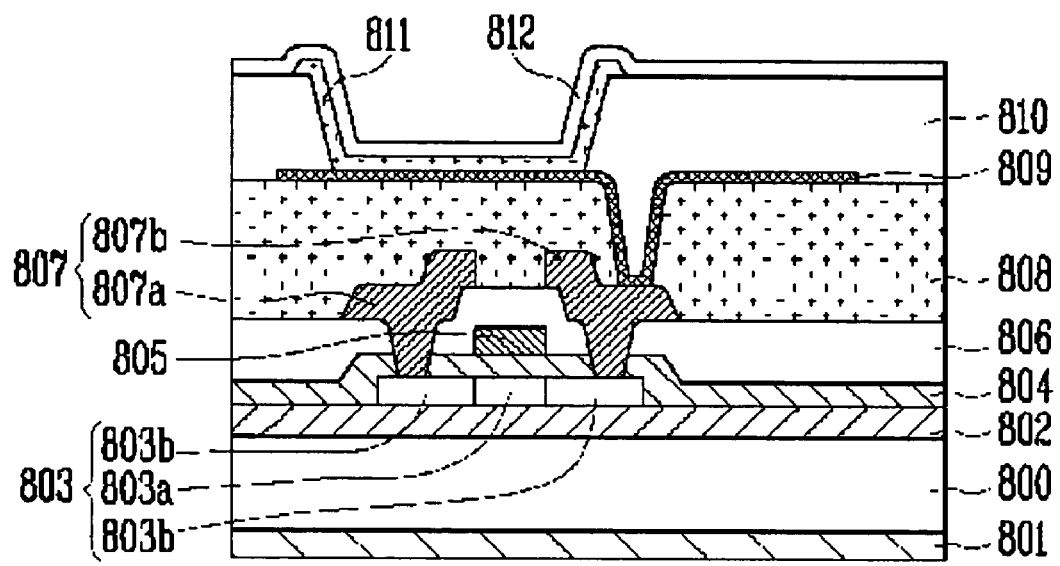
FIGS. 4A and 4B are cross-sectional views showing an embodiment of an organic light-emitting diode according to an aspect of the present invention.
Figure 4B:
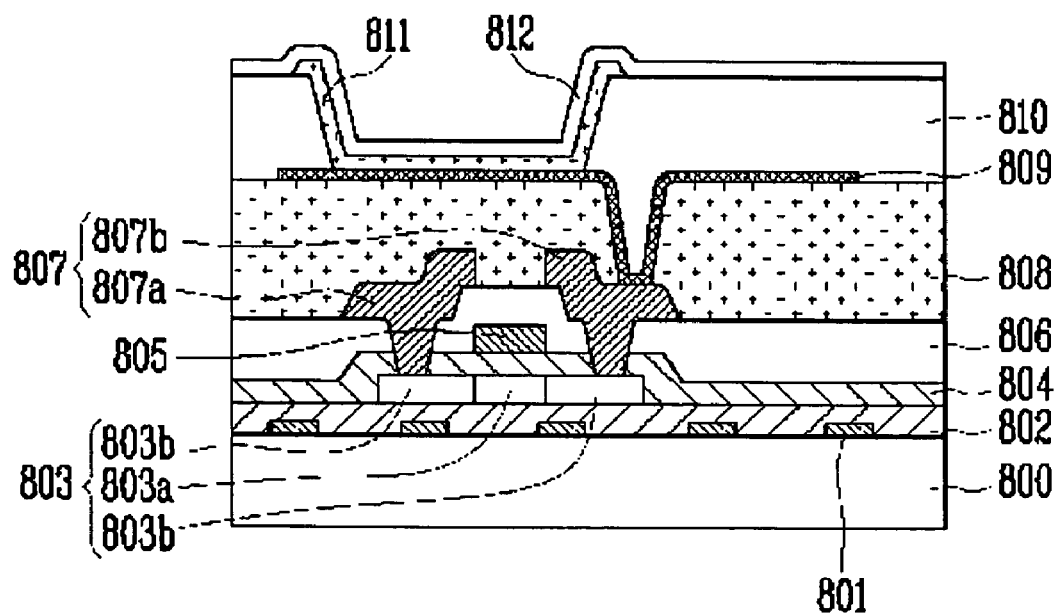

FIGS. 4A and 4B are cross-sectional views showing an embodiment of an organic light-emitting diode according to an embodiment of the present invention.

Referring to FIGS. 4A and 4B, the organic light-emitting diode according to aspects of the present embodiment, has a buffer layer 802, a semiconductor layer 803, a gate insulating layer 804, a gate electrode 805, an interlayer insulating layer 806, source and drain electrodes 807a, 807b and an over coat 808, all formed on the substrate 800.

The buffer layer 802 is formed on the substrate 800, and on one region of the buffer layer 802 is formed the semiconductor layer 803 including an active layer 803a and an ohmic contact layer 803b. The magnet 801 may be formed in a lower surface of the substrate 800, as shown in FIG. 4A, and the magnet 801 may be formed between the substrate 800 and the buffer layer 802, as shown in FIG. 4B. The magnet 801 can be a permanent magnet or an electromagnet, and may be arranged as one flat shape, a concentric circle, or a plurality of horizontal and vertical rows.

Since the organic light-emitting diode includes the semiconductor layer 803, the gate insulating layer 804 is formed on the buffer layer 802, and the gate electrode 805 having a width corresponding to that of the active layer 803a is formed on one region of the gate insulating layer 804.

Since the organic light-emitting diode includes the gate electrode 805, the interlayer insulating layer 806 is formed on the gate insulating layer 804, and source and drain electrodes 807a, 807b are formed on a predetermined region of the interlayer insulating layer 806.

The source and drain electrodes 807a, 807b are formed so that they can be connected with one exposed region of the Ohmic contact layer 803b, and an over coat 808 is formed on the interlayer insulating layer 806 since the organic light-emitting diode includes the source and drain electrodes 807a, 807b.

The first electrode layer 809 is formed on one region of the over coat 808, wherein the first electrode 809 is connected with any one exposed region of the source and drain electrodes 807a, 807b.

Since the organic light-emitting diode includes the first electrode layer 809, a pixel barrier 810 having an opening (not shown) for exposing at least one region of the first electrode layer 809 is formed on the over coat 808.

A light-emitting layer 811 is formed on an opening of the pixel barrier 810, and the second electrode layer 812 is formed on the pixel barrier 810 since the organic light-emitting diode includes the light-emitting layer 811.

As described above, the laser induced thermal imaging method according to an aspect of the present invention improves the close adhesion, as well as life span, yield and reliability of the organic light-emitting diode since the laser thermal transfer is carried out under a vacuum state, and foreign substances are eliminated as is space between the donor film and the acceptor substrate when the donor film and the acceptor substrate are laminated using the laser induced thermal imaging method. The improvements are achieved by a magnetic force generated between a magnet formed in the acceptor substrate and a magnetic substance formed in the contact frame to laminate the donor film and the acceptor substrate.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A laser induced thermal imaging apparatus comprising:
   a processing chamber having a donor film and an acceptor substrate containing a magnet to carry out a process for transferring an imaging layer of the donor film onto the acceptor substrate;
   a substrate stage arranged in the processing chamber, and supporting the acceptor substrate;
   a contact frame having a magnetic substance arranged in the chamber such that the donor film is between the contact frame and the acceptor substrate; and
   a laser oscillator formed either outside or inside the processing chamber to irradiate a laser on the donor film.

2. The laser induced thermal imaging apparatus according to claim 1, wherein the magnetic substance is formed on a surface of the contact frame toward the substrate stage or an opposite surface of the contact frame away from the substrate stage.

3. The laser induced thermal imaging apparatus according to claim 1, wherein the contact frame itself is formed of the magnetic substance.

4. The laser induced thermal imaging apparatus according to claim 1, wherein the magnet is formed on a surface of the acceptor substrate toward the donor film or on an opposite surface of the acceptor substrate away from the donor film.

5. The laser induced thermal imaging apparatus according to claim 1, wherein the magnet is a permanent magnet.

6. The laser induced thermal imaging apparatus according to claim 5, wherein the permanent magnet is formed in at least one shape of a rod and a cylinder.

7. The laser induced thermal imaging apparatus according to claim 5, wherein the permanent magnet is composed of permanent magnet nanoparticles.

8. The laser induced thermal imaging apparatus according to claim 1, wherein the magnet is an electromagnet.

9. The laser induced thermal imaging apparatus according to claim 8, wherein the electromagnet is formed in at least one shape of a rod or cylinder.

10. The laser induced thermal imaging apparatus according to claim 1, wherein the contact frame has a corresponding pattern of an opening formed in a region to which the donor film is transferred.

11. The laser induced thermal imaging apparatus according to claim 1, further comprising a to and fro-driving unit connected with the contact frame to control driving of the contact frame toward and away from the substrate stage.

12. The laser induced thermal imaging apparatus according to claim 11, wherein the to and fro-driving unit controls an adhesive strength between the donor film and the acceptor substrate.

13. The laser induced thermal imaging apparatus according to claim 1, wherein the laser oscillator is arranged in a portion of the chamber on the opposite side of the contact frame from the substrate stage.

14. The laser induced thermal imaging apparatus according to claim 1, wherein the processing chamber is a vacuum chamber.

15. The laser induced thermal imaging apparatus according to claim 1, wherein the substrate stage has a first arrangement groove to arrange the acceptor substrate and a second arrangement groove to arrange the donor film.

16. The laser induced thermal imaging apparatus according to claim 15, wherein the second arrangement groove is the shape of the donor film outside a perimeter of the first arrangement groove.

17. The laser induced thermal imaging apparatus according to claim 1, further comprising:
   a first placement unit to place the acceptor substrate on the substrate stage;
   a second placement unit to place the donor film onto the substrate stage;
   a first pin to drive the first placement unit to and fro; and
   a second pin to drive the second placement unit to and fro.

18. The laser induced thermal imaging apparatus according to claim 17, further comprising an end-effector to transfer the acceptor substrate to the first placement unit and the donor film to the second placement unit.

* * * * *